(12) United States Patent
Kamm et al.

(10) Patent No.: US 7,588,867 B2
(45) Date of Patent: Sep. 15, 2009

(54) REFLECTION MASK, USE OF THE REFLECTION MASK AND METHOD FOR FABRICATING THE REFLECTION MASK

(75) Inventors: Frank-Michael Kamm, Dresden (DE); Rainer Pforr, Dresden (DE); Christian Crell, Forstinning (DE)

(73) Assignee: Infineon Technologies AG, Munich (DE)

( * ) Notice: Subject to any disclaimer, the term of this patent is extended or adjusted under 35 U.S.C. 154(b) by 624 days.

(21) Appl. No.: 11/158,271

(22) Filed: Jun. 21, 2005

(65) Prior Publication Data
US 2005/0287447 A1    Dec. 29, 2005

(30) Foreign Application Priority Data
Jun. 22, 2004  (DE)  ........... 10 2004 031 079

(51) Int. Cl.
*G03F 1/00* (2006.01)
*H01L 21/00* (2006.01)
(52) U.S. Cl. .......................... 430/5; 430/311
(58) Field of Classification Search .............. 430/5, 430/311
See application file for complete search history.

(56) References Cited

U.S. PATENT DOCUMENTS

| 6,013,399 | A | * | 1/2000 | Nguyen | 430/5 |
| 6,352,803 | B1 | | 3/2002 | Tong et al. | |
| 6,596,465 | B1 | | 7/2003 | Mangat et al. | |
| 6,607,862 | B2 | | 8/2003 | Yan et al. | |
| 6,635,952 | B2 | * | 10/2003 | Inoh et al. | 257/618 |
| 6,749,973 | B2 | | 6/2004 | Shoki et al. | |
| 6,815,129 | B1 | | 11/2004 | Bjorkholm et al. | |
| 7,031,428 | B2 | | 4/2006 | Dinger et al. | |
| 7,348,105 | B2 | | 3/2008 | Ishibashi et al. | |
| 2002/0014403 | A1 | | 2/2002 | Hoshino | |
| 2003/0064296 | A1 | | 4/2003 | Yan | |
| 2003/0198874 | A1 | * | 10/2003 | Lee | 430/5 |
| 2004/0030814 | A1 | | 2/2004 | Kamm et al. | |

FOREIGN PATENT DOCUMENTS

| DE | 101 39 188 A1 | 3/2003 |
| DE | 102 35 255 A1 | 2/2004 |
| JP | 2001-291661 | 10/2001 |
| JP | 2004-039884 | 2/2004 |
| KR | 2002-0010912 | 2/2002 |
| WO | WO 00/75727 A2 | 12/2000 |
| WO | WO 02/27403 A1 | 4/2002 |

* cited by examiner

*Primary Examiner*—Mark F Huff
*Assistant Examiner*—Jonathan Jelsma
(74) *Attorney, Agent, or Firm*—Slater & Matsil, L.L.P.

(57) ABSTRACT

A reflection mask that includes a structure (20) for lithographically transferring a layout onto a target substrate, in particular for use in EUV lithography, and a reflective multilayer structure (11). At least one flare reduction layer (13', 17) is at least partly arranged on a bright field of the multilayer structure (11).

21 Claims, 7 Drawing Sheets

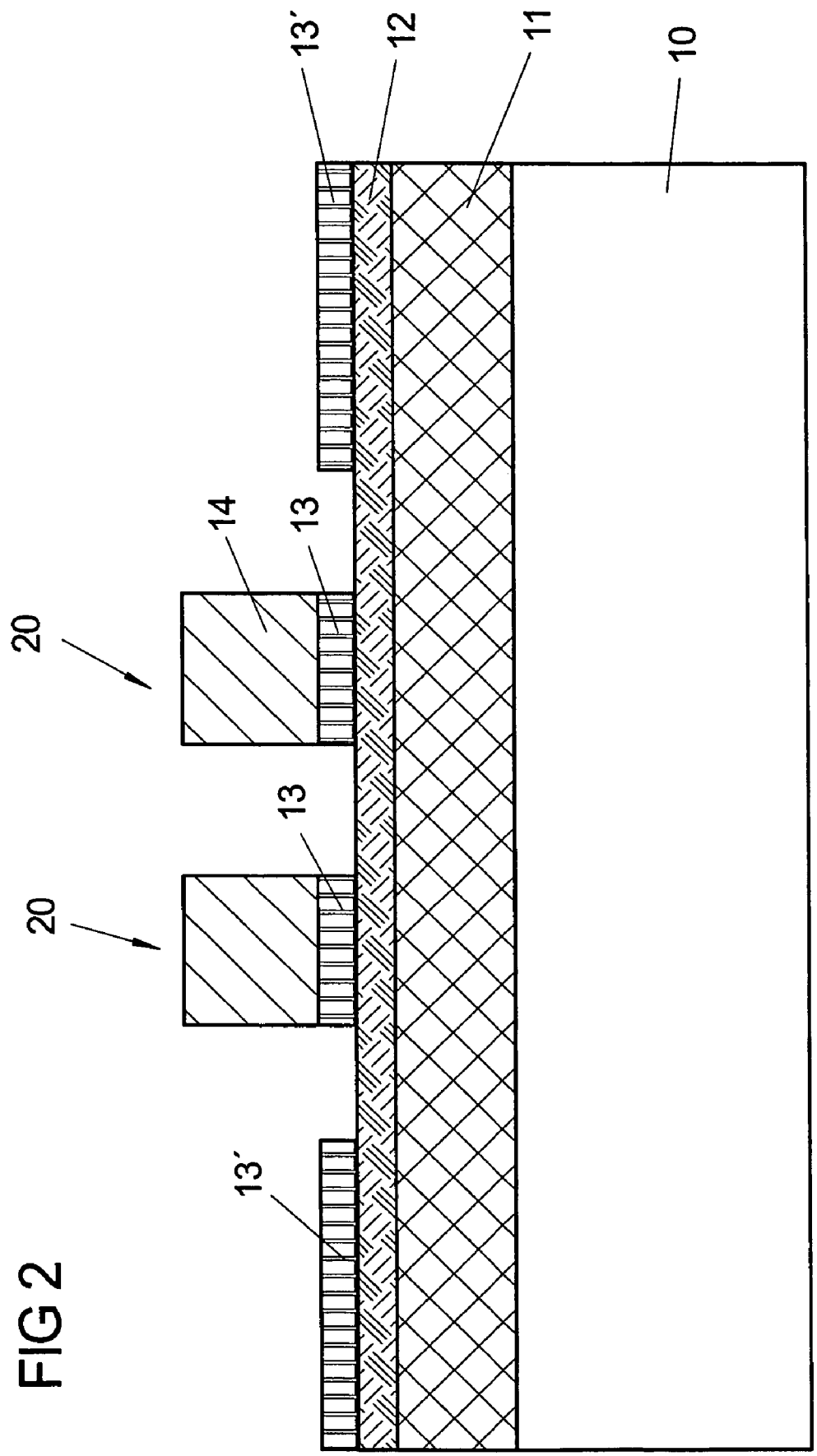

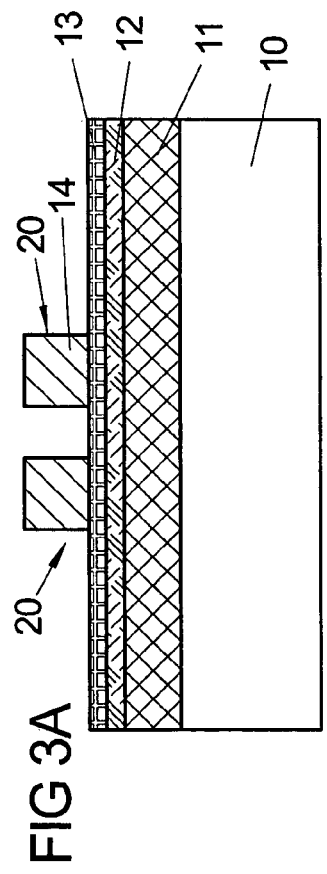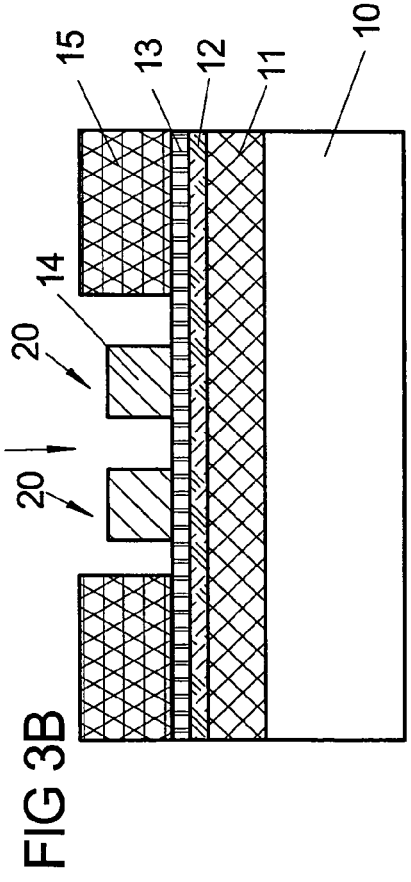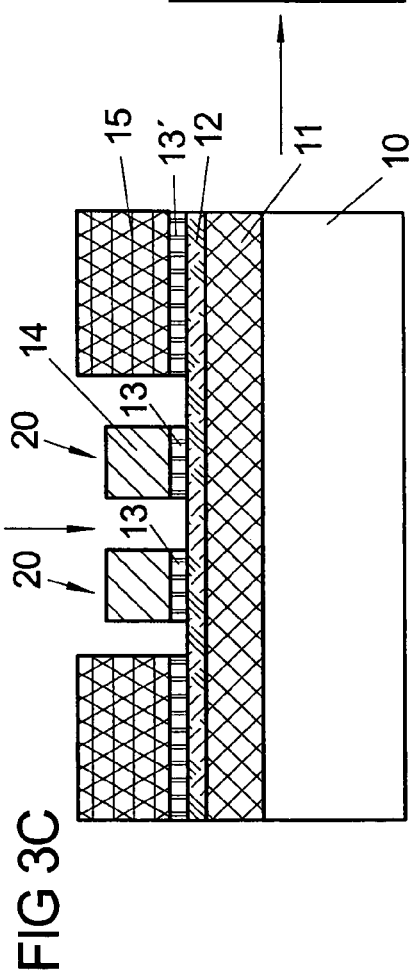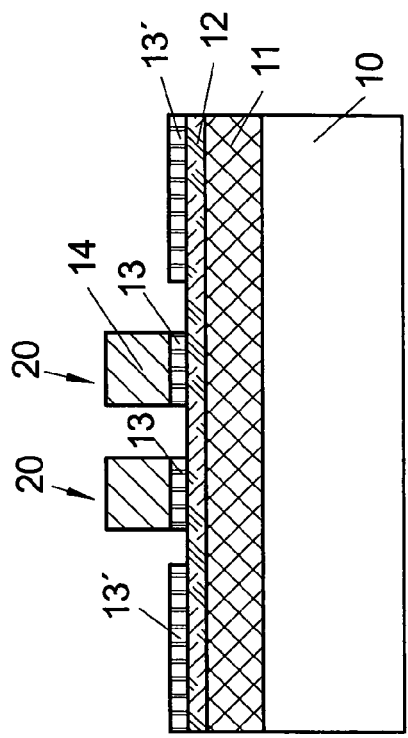

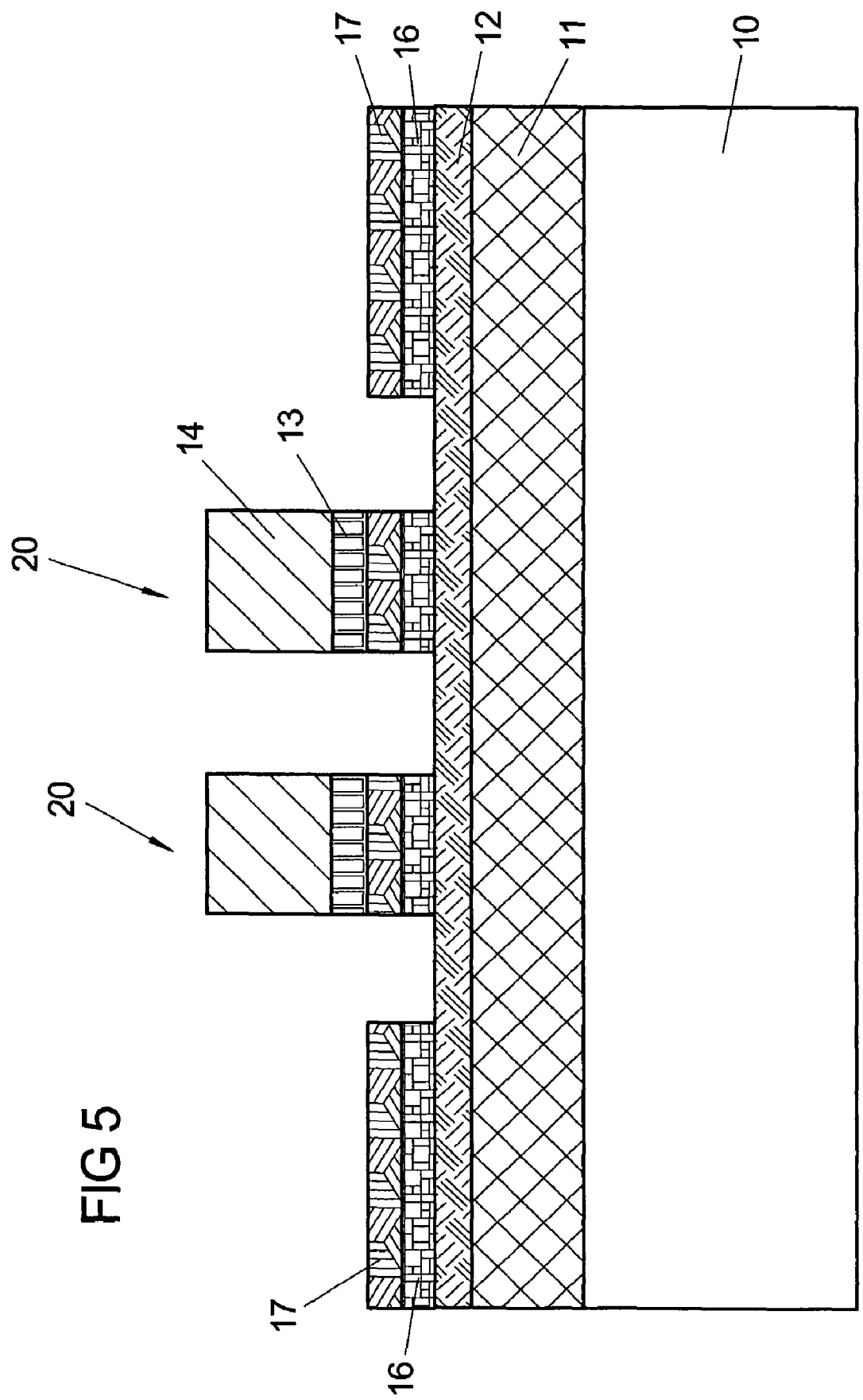

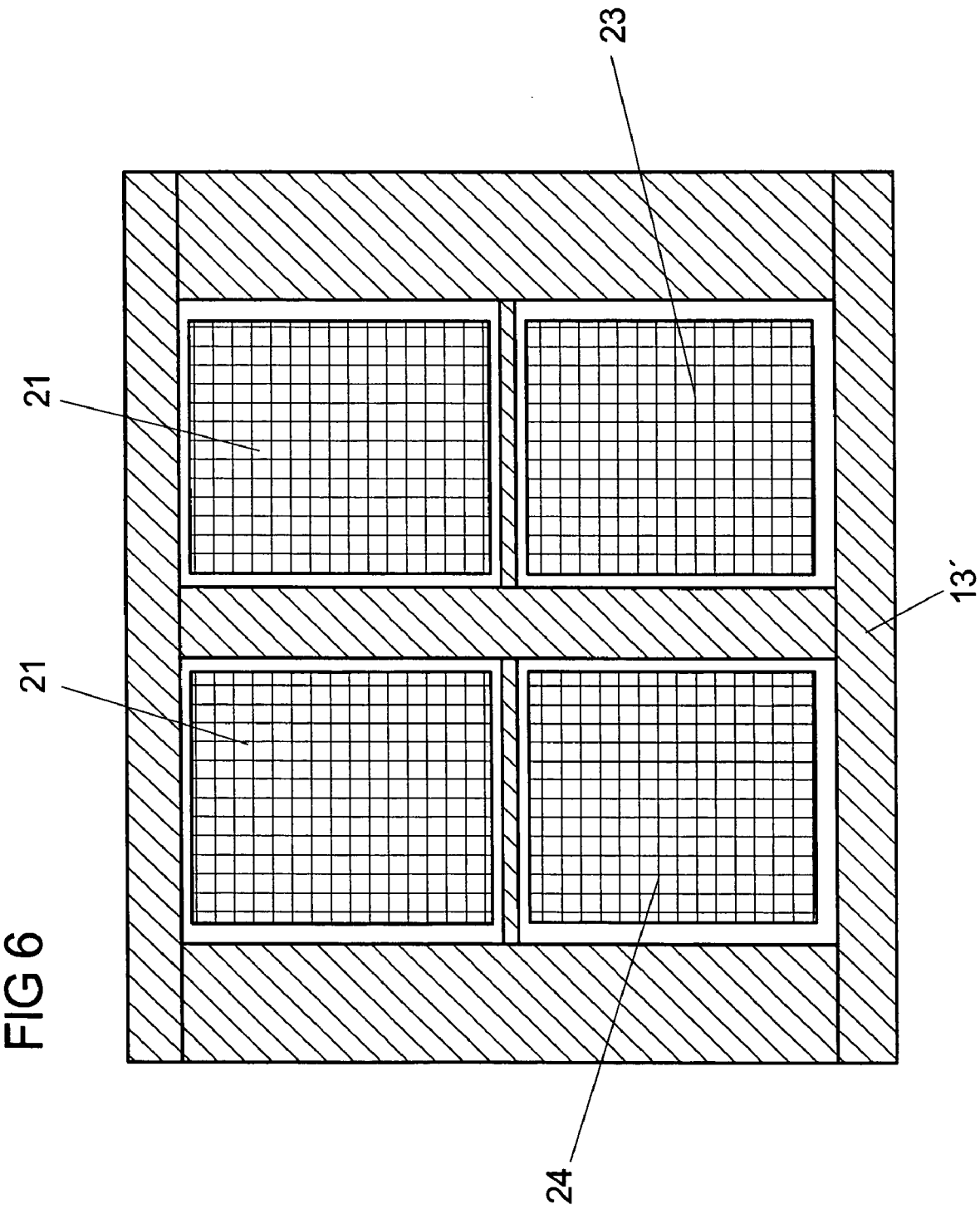

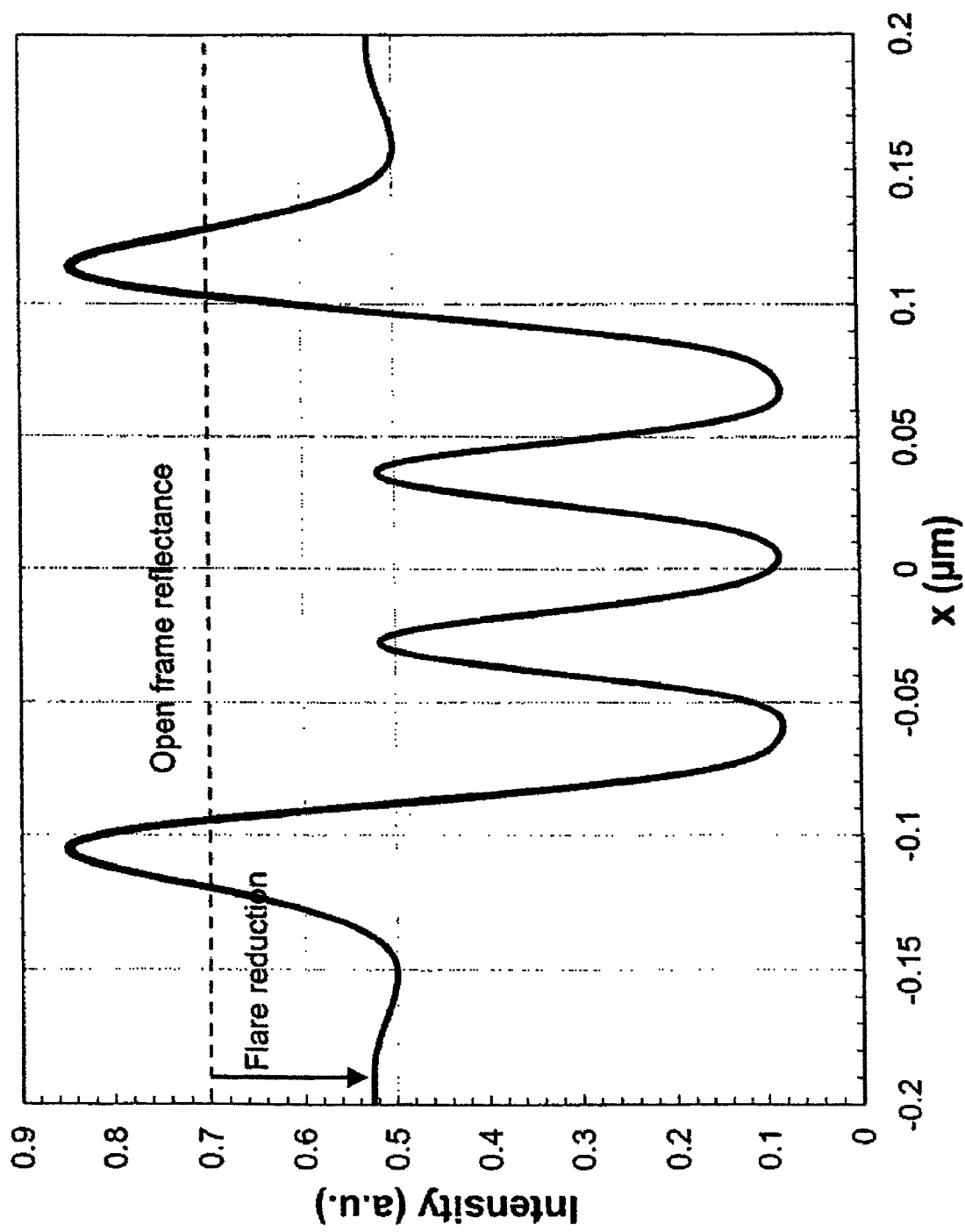

REFLECTION MASK, USE OF THE REFLECTION MASK AND METHOD FOR FABRICATING THE REFLECTION MASK

This application claims priority to German Patent Application 10 2004 031 079.3, which was filed Jun. 22, 2004, and is incorporated herein by reference.

TECHNICAL FIELD

The invention relates to reflection mask, uses of reflection masks and methods for fabricating reflection masks.

BACKGROUND

In the lithographic fabrication of semiconductor components, such as, e.g., DRAM memory chips, use is made of masks whose structure is transferred onto a target substrate, e.g., a wafer, by means of a light-sensitive resist.

Since the structures to be transferred are becoming smaller and smaller, it is necessary to work with ever shorter exposure wavelengths, such as, e.g., 157 nm or 13.5 nm (extreme ultraviolet or EUV). The requirements made of the corresponding lithographic masks thus change as well. At exposure wavelengths in the EUV range, reflection masks are used instead of transmission masks.

At the ever-shortening exposure wavelengths, diffuse background scattered light (flare) leads to an undesirable reduction of contrast when reflection masks are used. The reduction of contrast leads to a decrease in the size of the process window.

In this case, the scattered light intensity is inversely proportional to the square of the exposure wavelength, i.e., the scattered light increases to a very great extent as exposure wavelengths decrease.

Thus, given the same surface roughness of the lenses or mirrors used as optical elements, the effect for EUV technology at 13.5 nm is more than a hundred times greater than at 157 nm.

The atomic roughness of the optical surfaces represents a theoretical minimum since a minimal flare level of 8% is to be expected in the case of EUV technology.

Since EUV technology uses reflection masks and not transmission masks, it is not possible to use rear-side antireflection layers (ARC) for reducing the influence of flare.

The influence on the process window can be reduced, under certain circumstances, by local adaptation of the critical structure dimensions (critical dimension, local biasing), whereby variations in the flare over the entire image field are not corrected, however. It is also possible to correct the local flare variations by means of different bright field portions of the mask only with a high data-technological outlay. One example of compensation of the changes in the CD that are produced by flare is described in PCT Publication WO 02/27403 and corresponding U.S. Pat. No. 6,815,129.

Furthermore, time-dependent influences such as, e.g., an alteration of the imaging optics during operation cannot be taken into account with this method.

In general, the difficulty exists that transmission mask concepts cannot readily be applied to reflection masks since, particularly, the oblique incidence of light in the case of reflection masks leads to shading effects. All structures on a reflection mask must, therefore, be made as flat as possible.

SUMMARY OF THE INVENTION

Embodiments of the present invention provide a reflection mask and a use of the reflection mask with which flare effects are suppressed and at the same time a mask that is as thin as possible is provided.

In a first embodiment, a reflection mask with a structure for lithographically transferring a layout onto a target substrate, in particular for use in EUV lithography, and with a reflective multilayer structure having at least one flare reduction layer that is arranged at least partly on a bright field of the multilayer structure is provided By virtue of at least one flare reduction layer that is arranged at least partly on a bright field of the multilayer structure, the effect of the scattered light is suppressed without additional layers having to be applied to the mask.

In this case, it is advantageous if at least one flare reduction layer is arranged at a predetermined spacing around the structure.

It is particularly advantageous if at least one flare reduction layer is part of a buffer layer, which has to be applied anyway for the case of repairs to the absorber layer.

Furthermore, it is advantageous if at least one flare reduction layer is arranged as a layer on or under a capping layer or an etching stop layer.

At least one flare reduction layer advantageously comprises $SiO_2$. In an advantageous manner, at least one flare reduction layer has a layer thickness of between about 10 and about 30 nm, in particular about 20 nm.

An absorber layer advantageously comprises TaN or chromium, and a buffer layer advantageously comprises $SiO_2$ or chromium.

A combination of a buffer layer made of $SiO_2$ and an absorber layer made of chromium is particularly advantageous.

The reflection mask is useful in the fabrication of semiconductor components, for example DRAM fabrication.

In another aspect, the invention provides a method for fabricating a reflection mask. In this case, a reflective multilayer structure is arranged on a substrate. A capping layer is arranged on the multilayer structure. A buffer layer is arranged on the capping layer. An absorber layer is arranged above the buffer layer. After patterning of the buffer layer at least one part of the buffer layer and/or a separate flare reduction layer for suppressing flare are arranged in bright field regions above the multilayer structure.

BRIEF DESCRIPTION OF THE DRAWINGS

The invention is explained in more detail below using a number of exemplary embodiments with reference to the figures of the drawings, in which:

FIG. 2 shows a schematic sectional view of a first embodiment of a reflection mask according to the invention;

FIGS. 3A-3D show schematic sectional views of individual fabrication steps for fabricating a reflection mask in accordance with the first embodiment;

FIG. 5 shows a schematic sectional view of a third embodiment of the reflection mask according to the invention;

FIG. 6 shows a schematic plan view of a patterned region with a flare reduction layer; and FIG. 7 shows simulation results for flare reduction on a structure with three dark lines.

Figure 1:
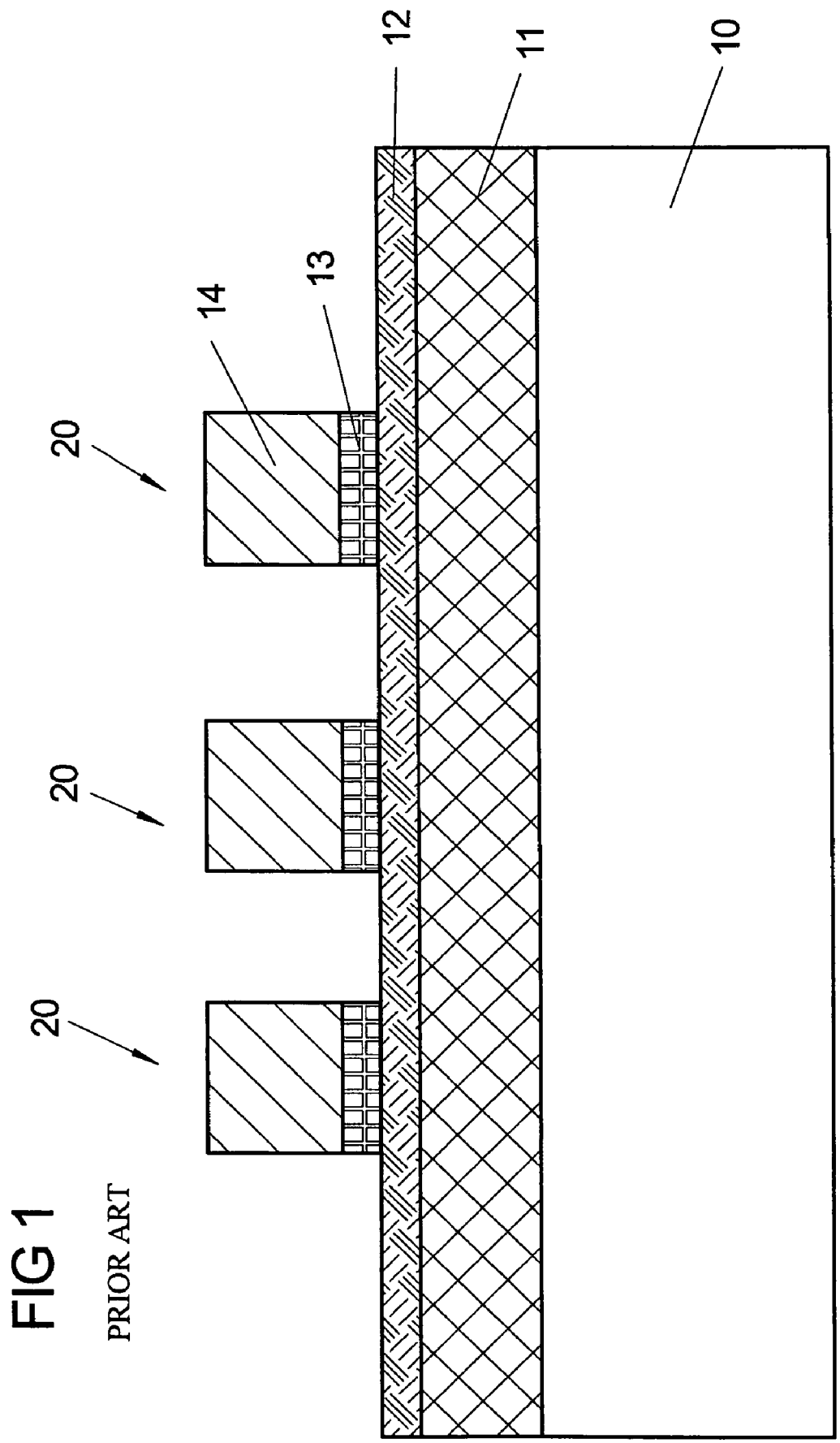
FIG. 1 shows a schematic sectional view of an EUV reflection mask according to the prior art.

The following list of reference symbols can be used in conjunction with the figures:
10 Substrate
11 Multilayer structure
12 Capping layer
13 Buffer layer
13' Flare reduction layer
14 Absorber layer
15 Resist layer
16 Etching stop layer
17 Additional flare reduction layer
20 Structure
21, 22, 23, 24 Patterned regions

DETAILED DESCRIPTION OF ILLUSTRATIVE EMBODIMENTS

FIG. 1 shows the typical construction of a reflection mask known per se in a sectional view. This reflection mask and all further masks described here are intended to be used in EUV lithography (e.g., 13.5 nm). The reflection masks can also be used at other wavelengths, in principle.

A multilayer structure 11 is arranged on a substrate 10 made of a low-thermal-expansion material (e.g., highly doped quartz glass or glass ceramic). The multilayer structure 11 has a multiplicity (e.g., 40 double layers) of individual layers. For example, the multilayer structure 11 can be constructed from molybdenum and silicon in a known manner.

In the illustrated embodiment, a capping layer 12 made of silicon is arranged as a protective layer above the reflective multilayer structure 11.

Structures 20 are arranged on the capping layer 12. These structures 20 serve for structure production when the reflection mask is irradiated with oblique incidence of light (e.g., 5 to 6 degrees with respect to a plane that is perpendicular to the surface).

The structures 20 have a buffer layer 13 at the bottom and above that an absorber layer 14 for absorbing the exposure radiation. The absorber layer 14 serves for producing a structure on a target substrate (not illustrated here). The light reflected from the reflection mask has a bright-dark pattern, bright fields being generated by the multilayer structure 11 and dark fields being generated by the absorption layer 14.

In this case, TaN is used as material for the absorber layer 14. In this case, a chromium layer is used as buffer layer 13.

As an alternative, an $SiO_2$ layer is used as buffer layer 13 in conjunction with an absorber layer 14 made of chromium.

A reflection mask in accordance with FIG. 1 is fabricated by lithographic methods in a manner known per se by layers being applied to the substrate 10 and subsequently being patterned, e.g., by etching. Thus, e.g., the buffer layer 13 and the absorber layer 14 are etched in such a way that the structures 20 remain. This gives rise to relatively large bright fields on the multilayer 11, which are problematic owing to the flare effect.

FIG. 2 illustrates a first embodiment of a reflection mask according to the invention. The layer construction and the materials essentially correspond to those in FIG. 1, so that reference is made to the corresponding description.

In order to prevent flare effects, in this case the approximately 20 nm thick $SiO_2$ buffer layer 13 is etched only with a relatively narrow spacing around the structures 20. The buffer layer 13 with medium to low EUV absorption thus remains as a functional layer, namely as a flare reduction layer 13', in that it covers regions of the bright field around the structures 20 and thus reduces the flare effect. A quantitative representation of the reduction with such a configuration is described in connection with FIG. 7.

The thickness of the buffer layer 13, and thus of the flare reduction layer 13', is optimized with regard to the optical properties such that the partial transmission of the layer (relative to the EUV light reflected from the multilayer structure 11) is sufficient to expose a photoresist on the target substrate. The buffer layer 13 and the flare reduction layer are preferably partly transparent. At the same time, the layer thickness of the buffer layer 13 and of the flare reduction layer must be large enough to suppress undesirable scattered light. In this case, the layer thickness is to be chosen such that the process window is not restricted by the additional absorption in the buffer layer 13 in the large unpatterned bright field regions.

In this case, a contrast enhancement is to be expected on account of the reduction of the scattered light. Moreover, the uniformity of the CD (critical dimension) over the image field is complied with better since variations in the flare over the image field have a smaller influence.

FIGS. 3A to 3D illustrate what method steps are performed for fabricating a reflection mask in accordance with FIG. 2.

The starting point (FIG. 3A) is a reflection mask having an unpatterned layer stack comprising substrate 10, multilayer structure 11, capping layer 12 and buffer layer 13. An absorber layer 14 is arranged above the buffer layer 13, the absorber layer already being patterned. The buffer layer 13 serves to protect the multilayer structure 11 in the event of a possibly required repair (e.g., by means of ion beams) of the absorber layer 14.

In a first method step (FIG. 3B) a resist layer 15 is applied, the resist layer being lithographically removed again in a relatively narrow region around the structures 20.

Afterwards, in a second method step (FIG. 3C), the buffer layer 13 is etched in the region around the structures 20. The bright fields outside the etching region are protected by the resist layer 15.

Finally, in a third method step (FIG. 3D) the resist layer 15 is removed and the structure in accordance with FIG. 2 is obtained.

Figure 4:
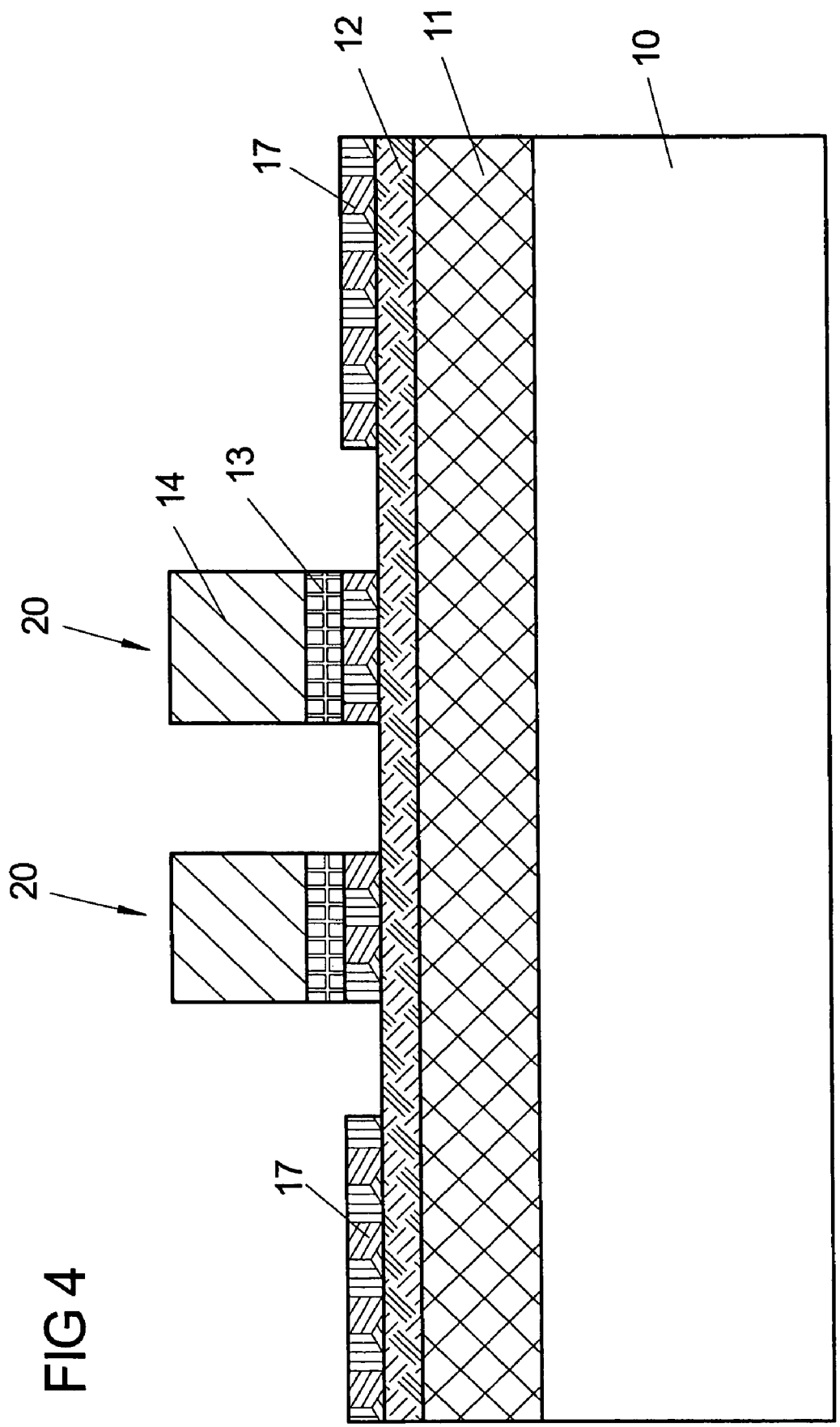
FIG. 4 shows a schematic sectional view of a second embodiment of the reflection mask according to the invention.

FIG. 4 illustrates a second embodiment of the reflection mask according to the invention. This represents a modification of the first embodiment (FIG. 2), so that reference may be made to the corresponding description of the reflection mask and the fabrication thereof (FIG. 3).

In addition, in the second embodiment, a further flare reduction layer 17 is applied below the buffer layer 13 and above the capping layer 12. This embodiment is expedient particularly when a repair (e.g., ion radiation) of the absorber layer requires a minimum thickness of the buffer layer 13 that would mean an excessively high absorption.

FIG. 5 illustrates a third embodiment of the reflection mask according to the invention, which is a modification of the second embodiment (FIG. 4). An etching stop layer 16 is arranged above the capping layer 12, a separate flare reduction layer 17 then being arranged on the etching stop layer.

In principle, the etching stop layer 16 may also lie above the separate flare reduction layer 17.

FIG. 6 schematically illustrates a plan view of part of a reflection mask. In this case, patterned regions 21, 22, 23, 24 are surrounded by a flare reduction layer 13'. The flare reduction layer 13' is formed as part of the buffer layer 13 here in the sense of the first embodiment.

FIG. 7 illustrates the effect of the flare reduction according to another embodiment of the invention in the form of a simulation example. Three linear structures 20 (as illustrated in FIG. 2) were simulated.

The center lines of the structures 20 lie approximately 0.07 μm apart from one another.

The structures 20 bring about three intensity minima since the absorber structures produce dark fields.

Without particular measures for flare reduction, an intensity level of 0.7 (measured in an arbitrary unit) is achieved.

In this case, a 20 nm thick layer made of $SiO_2$, which surrounds the three structures 20 laterally (see, e.g., FIG. 2), is used as flare reduction layer 13'. The immediate region around the structures 20 is not covered by the flare reduction layer 13', in accordance with FIG. 2.

The effect of the flare reduction layer 13' is apparent from the fact that the intensity of the reflected radiation including the flare in the corresponding regions around the structures 20 (x between −0.15 and −0.2 μm and 0.15 and 2 μm) is lowered from approximately 0.7 to 0.52. The lower intensity is that which is also present in the region of the center of the structures 20. This means that the reflected intensity in the region of the bright fields (x between −0.15 and −0.2, and 0.15 and 0.2) is still greater than or equal to the maximum intensity in the patterned regions. The consequence of this is that the full intensity amplitude of the patterned regions can be utilized in the imaging process.

The embodiment of the invention is not restricted to the preferred exemplary embodiments specified above. Rather, a number of variants are conceivable that make use of the reflection mask according to the invention and the method according to the invention also in the case of embodiments of fundamentally different configuration.

What is claimed is:

1. A reflection mask comprising:
   a substrate;
   a structure over the substrate, the structure shaped to generate a pattern onto a target substrate;
   a reflective multilayer structure over the substrate; and
   at least one flare reduction layer arranged at least partly on a bright field of the multilayer structure, wherein a spacing is present between the flare reduction layer and the structure,
   and wherein the flare reduction layer has a thickness of at least 10 nm.

2. The reflection mask according to claim 1, wherein the at least one flare reduction layer is spaced around the structure by a predetermined spacing distance.

3. The reflection mask according to claim 1, wherein the structure comprises a buffer layer and wherein the least one flare reduction layer is formed from the same layer as the buffer layer.

4. The reflection mask according to claim 1, wherein the at least one flare reduction layer is arranged as a layer on or under a capping layer or an etching stop layer.

5. The reflection mask according to claim 1, wherein the at least one flare reduction layer comprises $SiO_2$.

6. The reflection mask according to claim 1, wherein the at least one flare reduction layer has a layer thickness of between about 10 nm and about 30 nm.

7. The reflection mask according to claim 1, wherein the structure comprises an absorber layer made of TaN or chromium.

8. The reflection mask according to claim 1, wherein the structure comprises a buffer layer, the buffer layer comprising $SiO_2$ or chromium, 9. The reflection mask according to claim 1, wherein the structure comprises a buffer layer and an absorber layer, the buffer layer comprising $SiO_2$ and the absorber layer comprising chromium.

10. The reflection mask according to claim 1, wherein the reflective multilayer structure comprises a structure that is reflective of extreme ultraviolet light.

11. A method of manufacturing a semiconductor device, the method comprising:
    providing a reflection mask, the reflection mask comprising a substrate, an absorber structure over the substrate, a reflective multilayer structure over the substrate, and at least one flare reduction layer arranged at least partly on a bright field of the multilayer structure, the flare reduction layer having a thickness of at least 10 nm, wherein a spacing is present between the flare reduction layer and the absorber structure;
    providing a semiconductor wafer coated with a resist;
    reflecting radiation from the reflection mask onto the resist;
    removing a portion of the resist; and
    modifying the semiconductor wafer at portions exposed by the removed resist.

12. The method of claim 11, wherein modifying the semiconductor wafer comprises performing a step in the fabrication of a dynamic random access memory.

13. The method of claim 11, wherein reflecting radiation comprises reflecting extreme ultraviolet radiation.

14. The method of claim 11, wherein reflecting radiation comprises reflecting radiation having a wavelength of about 13.5 nm.

15. A method for fabricating a reflection mask, the method comprising:
    forming a reflective multilayer structure over a substrate;
    forming a capping layer over the multilayer structure;
    forming a buffer layer over the capping layer;
    forming an absorber layer over the buffer layer;
    patterning the absorber layer;
    patterning the buffer layer such that a portion of the buffer layer remains beneath the patterned absorber layer; and
    forming a flare reduction layer over the capping layer and spaced from the portion of the buffer layer beneath the patterned absorber layer such that a spacing is present between the flare reduction layer and the patterned absorber layer, the flare reduction layer having a thickness of at least 10 nm.

16. The method of claim 15, wherein patterning the buffer layer and forming the flare reduction layer are performed simultaneously by patterning the buffer layer such that a first portion of the buffer layer remains beneath the patterned absorber layer and a second portion of the buffer layer remains over the capping layer and spaced from the first portion of the buffer layer by a distance.

17. The method of claim 16, wherein forming a buffer layer comprises depositing an oxide layer.

18. The method of claim 15, wherein forming the flare reduction layer comprises:
    forming a separate flare reduction layer above the multilayer structure after patterning the buffer layer; and
    patterning the separate flare reduction layer to form the flare reduction layer.

19. The method of claim 18, further comprising forming an etch stop layer before forming the separate flare reduction layer.

20. The method of claim 15, wherein the absorber layer is formed from a material that will absorb radiation in the extreme ultraviolet range.

21. The reflection mask according to claim 1, further comprising a capping layer beneath the flare reduction layer.

* * * * *